(12) United States Patent
El-Kareh et al.

(10) Patent No.: US 7,772,057 B2
(45) Date of Patent: Aug. 10, 2010

(54) METHOD OF FABRICATING AN INTEGRATED CIRCUIT WITH GATE SELF-PROTECTION, AND AN INTEGRATED CIRCUIT WITH GATE SELF-PROTECTION

(75) Inventors: Badih El-Kareh, Cedar Park, TX (US); Scott Gerard Balster, Dallas, TX (US); Hiroshi Yasuda, Plano, TX (US); Manfred Schiekofer, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 673 days.

(21) Appl. No.: 11/470,760

(22) Filed: Sep. 7, 2006

(65) Prior Publication Data

US 2007/0057281 A1 Mar. 15, 2007

(51) Int. Cl.
*H01L 21/337* (2006.01)
(52) U.S. Cl. .................. 438/189; 438/190; 257/133; 257/131
(58) Field of Classification Search ............. 257/49–52, 257/E51.005, E29.151, 120, 131, 133; 438/189, 438/190
See application file for complete search history.

(56) References Cited

U.S. PATENT DOCUMENTS 5,504,362 A * 4/1996 Pelella et al. ............... 257/357
5,643,810 A 7/1997 Jang
5,760,445 A 6/1998 Diaz
6,277,708 B1 8/2001 Bothra et al.

FOREIGN PATENT DOCUMENTS

WO WO94/05042 3/1994

OTHER PUBLICATIONS

S.M. Sze, Physics of Semiconductor Devices 1981 John Wiley & Sons second edition p. 134.*

* cited by examiner

*Primary Examiner*—Thinh T Nguyen
(74) *Attorney, Agent, or Firm*—Jacqueline J. Garner; Wade J. Brady III; Frederick J. Telecky, Jr.

(57) ABSTRACT

An integrated circuit with gate self-protection comprises a MOS device and a bipolar device, wherein the integrated circuit further comprises a semiconductor layer with electrically active regions in which and on which the MOS device and the bipolar device are formed and electrically inactive regions for isolating the electrically active regions from each other. The MOS device comprises a gate structure and a body contacting structure, wherein the body contacting structure is formed of a base layer deposited in a selected region over an electrically active region of the semiconductor layer, and the body contacting structure is electrically connected with the gate structure. The base layer forming the body contacting structure also forms the base of the bipolar device. The present invention further relates to a method for fabricating such an integrated circuit.

11 Claims, 6 Drawing Sheets

METHOD OF FABRICATING AN INTEGRATED CIRCUIT WITH GATE SELF-PROTECTION, AND AN INTEGRATED CIRCUIT WITH GATE SELF-PROTECTION

The present invention relates to a method of fabricating an integrated circuit with gate self-protection which comprises a MOS device and a bipolar device. The present invention further relates to an integrated circuit with gate self-protection which comprises a MOS device and a bipolar device.

BACKGROUND

During the fabrication of integrated circuits which have a multiplicity of MOS (Metal Oxide Semiconductor) transistors, plasma process steps are often provided as part of the fabrication process. The plasma used in a plasma process step is able to electrically charge an electrically conductive supply conductor to a gate region of a field-effect transistor and to electrically charge the gate region. The charge which accumulates on the supply conductors and in the gate region can induce localized high electric fields that lead to intense currents through the gate oxide, resulting in trap generation and population within the gate dielectric and its interface with silicon, seriously degrading the dielectric. This phenomenon is mostly pronounced during the final stages of patterning the gate conductor, which is typically polysilicon, or conductors connected to it. The trapped charges decrease breakdown voltage of the oxide (also known as gate oxide integrity, GOI) and can cause shift in the threshold voltage and current-carrying capability resulting in reliability failures.

In the prior art several methods have been employed to protect devices against plasma damages. One typical approach to protect against plasma charging damage comprises the formation of a diode connected to the polycrystalline silicon layer, i.e. the gate electrode, thereby providing a discharge path for electrical charging during plasma processing. However, the formation of such a protective diode directly connected to the gate electrode before patterning the gate requires extra masking and implant steps.

SUMMARY

The present invention provides a method of fabricating an integrated circuit by means of which protection against plasma induced damage (PID) is provided, also during patterning of the gate conductor, without adding additional process steps to existing process flows.

According to the present invention the method comprises the step of depositing a dielectric layer over a semiconductor layer in which electrically active and electrically inactive regions are formed. A gate conductor layer is deposited over the dielectric layer and a base region of the bipolar device and a selected region of the MOS device are defined, wherein in the selected region of the MOS device the dielectric layer overlies an electrically active region of the semiconductor layer. The gate conductor layer is removed in the base region of the bipolar device and in the selected region of the MOS device. After that the dielectric layer is removed in the base region of the bipolar device and in the selected region of the MOS device. Subsequently a base layer is deposited on the gate conductor layer and on the semiconductor layer in the selected region of the MOS device and in the base region of the bipolar device. The base layer deposited in the selected region of the MOS device connects the MOS gate region with an electrically active region of the semiconductor layer. In this way, the MOS gate is already connected to the semiconductor layer before patterning of the gate conductor so that the charge carriers which accumulate in the gate region can be dissipated via the base layer into the semiconductor layer thereby providing gate self-protection against plasma induced damage. Typically, in the electrically active region of the selected region of the MOS device in which the gate conductor layer and the dielectric layer are removed an already existing protective diode is provided.

Providing the base layer in the selected region of the MOS device for establishing an electrical connection between the gate region and the semiconductor layer does not require additional process steps since the selected region is defined in the same process step in which the base region of the bipolar device is defined, and the base layer in the selected region is deposited in the same process step in which the base of the MOS device is deposited. Typically, the base layer is a silicon-germanium layer.

According to a preferred aspect of the method also an electrically inactive region of the semiconductor layer is located in the selected region. In the integrated circuit fabricated according to this method the base layer deposited over the electrically inactive region adjacent the electrical active region serves as a connecting structure for establishing the electrical connection between the gate region and the semiconductor layer.

According to a further preferred aspect of the method the drain region of the MOS device is located in the selected region of the MOS device. Thus, the deposited base layer overlies the drain region of the MOS device thereby establishing an electrical connection between the gate region and the drain region without the need for contact and metal wiring.

The present invention also provides an integrated circuit which is reliably protected against plasma charging damage, also during patterning of the gate conductor, without adding costs.

According to the present invention the integrated circuit comprises a semiconductor layer with electrically active regions in which and on which the MOS device and the bipolar device are formed and electrically inactive regions for isolating the electrically active regions from each other. The MOS device comprises a gate structure and a body contacting structure. The body contacting structure is formed of a base layer deposited in a selected region of the MOS device over an electrically active region of the semiconductor layer, and the body contacting structure is electrically connected with the gate structure. In this way the charge carriers which accumulate in the gate region can be dissipated via the body contacting structure into the semiconductor layer thereby reliably providing gate self-protection against plasma induced damage. Forming the body contacting structure does not add additional production costs since it is defined and created in the same process steps in which the base of the bipolar device is defined and created.

BRIEF DESCRIPTION OF THE DRAWINGS

Further features and advantages of the invention read from the following description of embodiments in accordance with the present invention and with reference to the drawings in which.

DETAILED DESCRIPTION OF THE EMBODIMENTS

Figure 1:
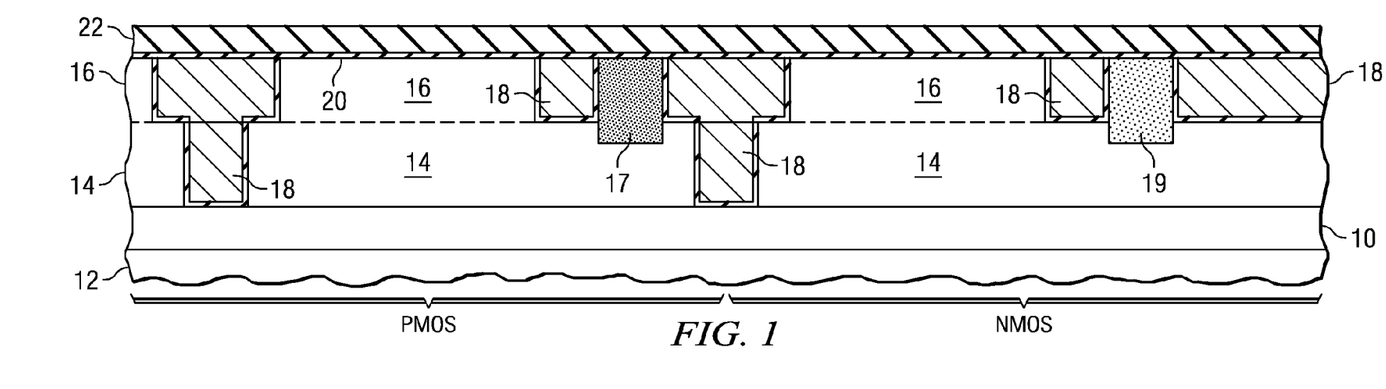
FIG. 1 shows in a schematic manner the part of the integrated circuit according to the present invention which is designated for building a CMOS device.
Figure 2:
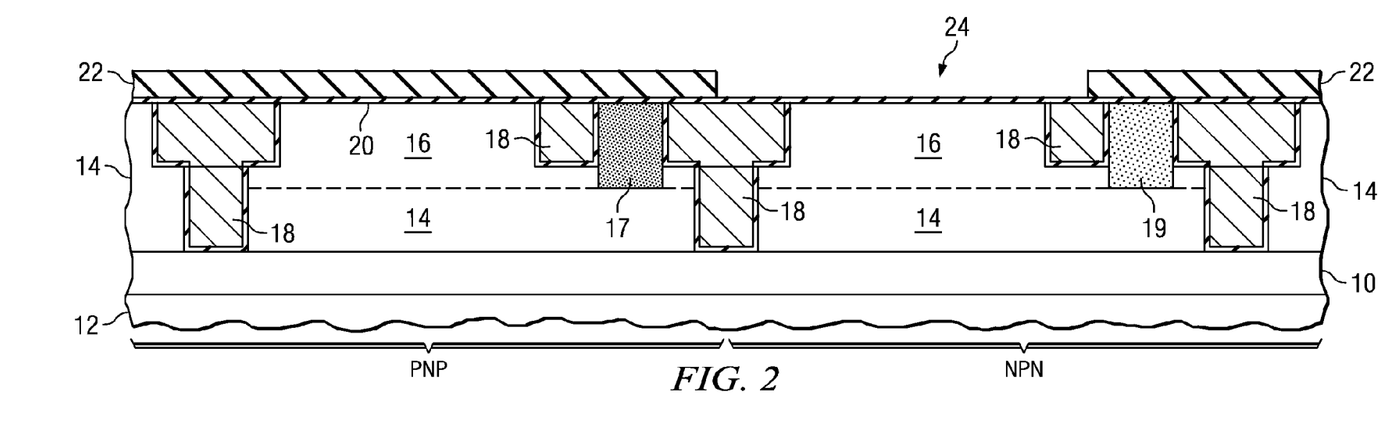
FIG. 2 shows in a schematic manner the part of the integrated circuit which is designated for building a PNP transistor and an NPN transistor after removing of the polysilicon layer in the base region of the NPN transistor.

FIG. 1 shows a first region of the integrated circuit according to the present invention for building a CMOS device with a PMOS transistor and an NMOS transistor. FIG. 2 shows a second region of the integrated circuit according to the present invention for building two bipolar devices, specifically a PNP transistor and an NPN transistor. The integrated circuit according to the present invention comprises a buried oxide layer 10 (BOX) that separates a support wafer 12 from a top single-crystal silicon layer 14. In the semiconductor layer 14 electrically active regions 16 and electrically inactive regions 1.8 for isolating the electrically active regions 16 from each other are formed. The electrically inactive regions 18 are preferably formed by trenches etched in the semiconductor layer which are filled with an isolating material such as oxide. The electrically active regions 16 comprise an N well region for the PMOS transistor and a P well region for the NMOS transistor in the CMOS device region (FIG. 1), and an N doped buried layer (NBL) and a P doped buried layer (PBL) in the respective bipolar device regions (FIG. 2). Preferably, P sinkers 17 and N sinkers 19 are formed in the electrically active regions 16 of the CMOS device and of the bipolar devices. The sinkers serve to reduce series resistance in the bipolar devices and can be placed in the CMOS structures without any added complexity in the BiCMOS process. Methods for forming the above-described structure are well-known from prior art and shall not be described here.

Figure 3:
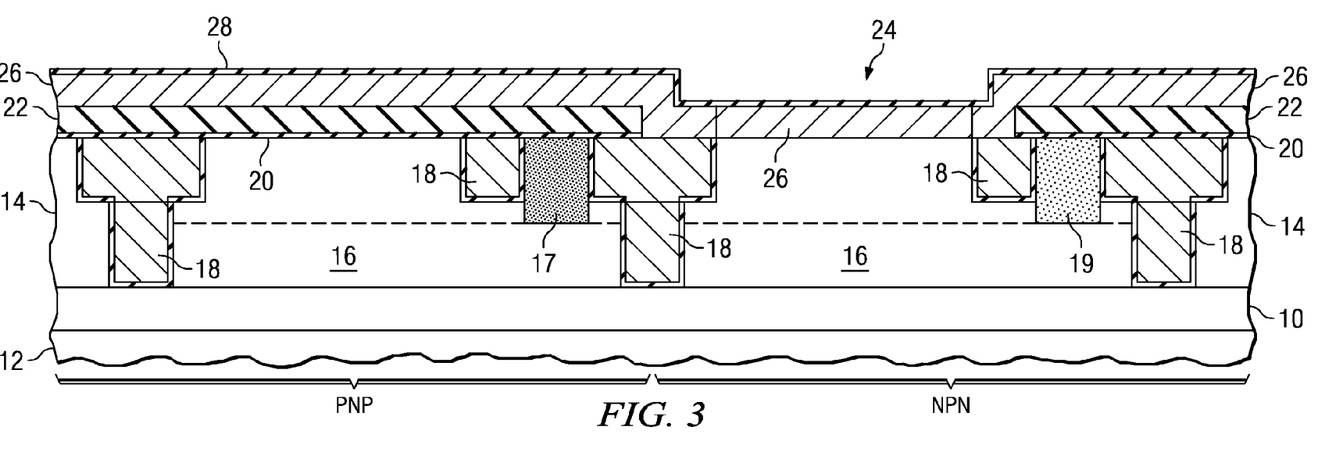
FIG. 3 shows in a schematic manner the part of the integrated circuit shown in FIG. 2 of the drawings after removing of the gate oxide in the base region and after deposition of a silicon-germanium layer and a screen oxide layer.

A first thin dielectric layer 20, which is typically an oxide layer, is grown on the semiconductor layer 14 which forms the gate oxide of the MOS transistors. In modem CMOS processes, the thickness of the gate layer typically ranges from 2 to 12 nm. A doped or undoped gate conductor layer 22, which is typically a polysilicon layer, is deposited over the gate oxide layer 20. A base region 24 of the NPN transistor is then defined by well-known patterning techniques which comprise, for example, applying a photoresist layer (not shown here) on the gate conductor layer 22, exposing selected regions of the photoresist layer, developing the photoresist, etching the regions of the gate conductor layer 22 which are no longer covered by the photoresist and removing of the remaining photoresist, as shown after patterning in FIG. 2. The gate conductor layer 22 is preferably etched by RIE (Reactive Ion Etching). After that the uncovered dielectric layer 20 in the NPN base region 24 is etched and a base layer 26 is deposited (FIG. 3).

The base layer is typically a silicon-germanium layer 26. In the regions in which the silicon-germanium layer 26 grows epitaxially the layer 26 is shown with horizontal lines, and in the regions in which the silicon-germanium layer 26 grows as a polycrystalline film the layer 26 is shown with diagonal lines. The silicon-germanium layer 26 grows epitaxially in the base region 24 of the NPN transistor over the exposed single-crystal semiconductor layer 14 and as polycrystalline silicon over the electrically inactive regions 18 and over the gate conductor layer 22. The silicon-germanium layer 26 is then covered with a screen oxide layer 28 in preparation for the next patterning step. The above-described method for patterning the base region of an NPN transistor and forming the gate regions of MOS transistors are also well-known from prior art.

According to the method of the present invention, when applying and exposing the photoresist layer not only the base region 24 of the NPN transistor is defined but also a selected region 30 of the PMOS device and a selected region 32 of the NMOS device. In each selected region 30, 32 an electrically active region 16 of the semiconductor layer 14 is located. Typically, in the electrically active regions of the selected regions of the CMOS device already existing protective diodes are provided. Specifically, these protective diodes are provided by the P sinker 17 and the N sinker 19 in the CMOS device region. In the preferred embodiment the selected region 30, 32 also comprise an electrically inactive region 18 adjacent to the electrically active region 16.

Figure 4:
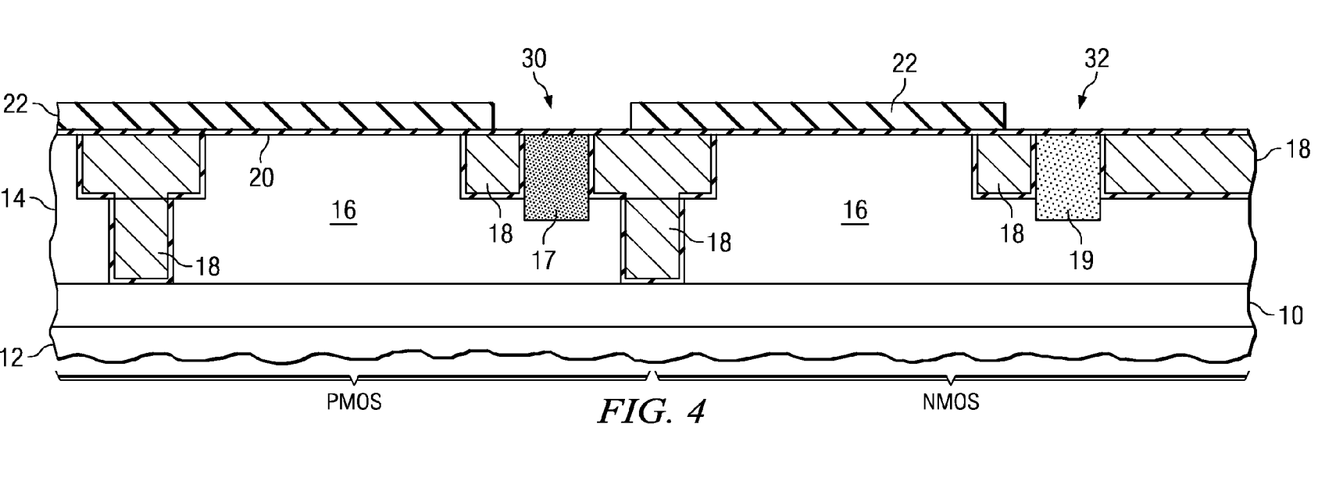
FIG. 4 shows in a schematic manner the part of the integrated circuit shown in FIG. 1 after removing of the polysilicon layer in selected regions of the CMOS device.

FIGS. 2 and 4 of the drawings show the integrated circuit after etching of the polysilicon layer 22 in the base region 24 of the NPN transistor and in the selected regions 30, 32 of the CMOS device wherein defining and etching of the base region 24 and the selected regions 30, 32 is made in the same process steps.

Figure 5:
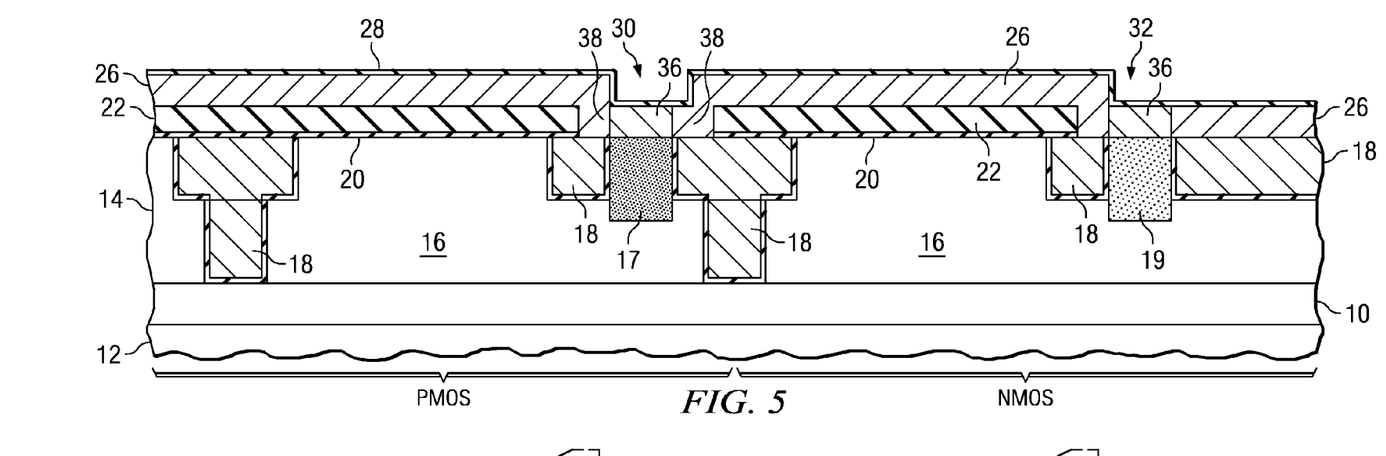
FIG. 5 shows in a schematic manner the CMOS device region of FIG. 4 after removing of the gate oxide and deposition of the silicon-germanium layer and a screen oxide layer.

FIG. 5 of the drawings shows the CMOS device after etching of the gate oxide layer 20 in the selected regions 30, 32 of the CMOS device and after deposition of the silicon-germanium layer 26. In the regions in which the silicon-germanium layer 26 grows epitaxially the layer 26 is shown with horizontal lines, and in the regions in which the silicon-germanium layer 26 grows as a polycrystalline film the layer 26 is shown with diagonal lines. As can be seen, the silicon-germanium layer 26 grows epitaxially over the single-crystal silicon of the semiconductor layer 14 and as a polycrystalline film over the adjacent electrically inactive regions 18 formed in the semiconductor layer 14 and over the polysilicon layer 22. In the following, the structure which is formed by the deposition of the silicon-germanium layer 36 in the selected regions 30, 32 over the single-crystal silicon of the semiconductor layer 14 is called body contacting structure 36. As can be further seen, the body contacting structures 36 are formed above the P sinker 17 and N sinker 19, respectively.

Figure 6:
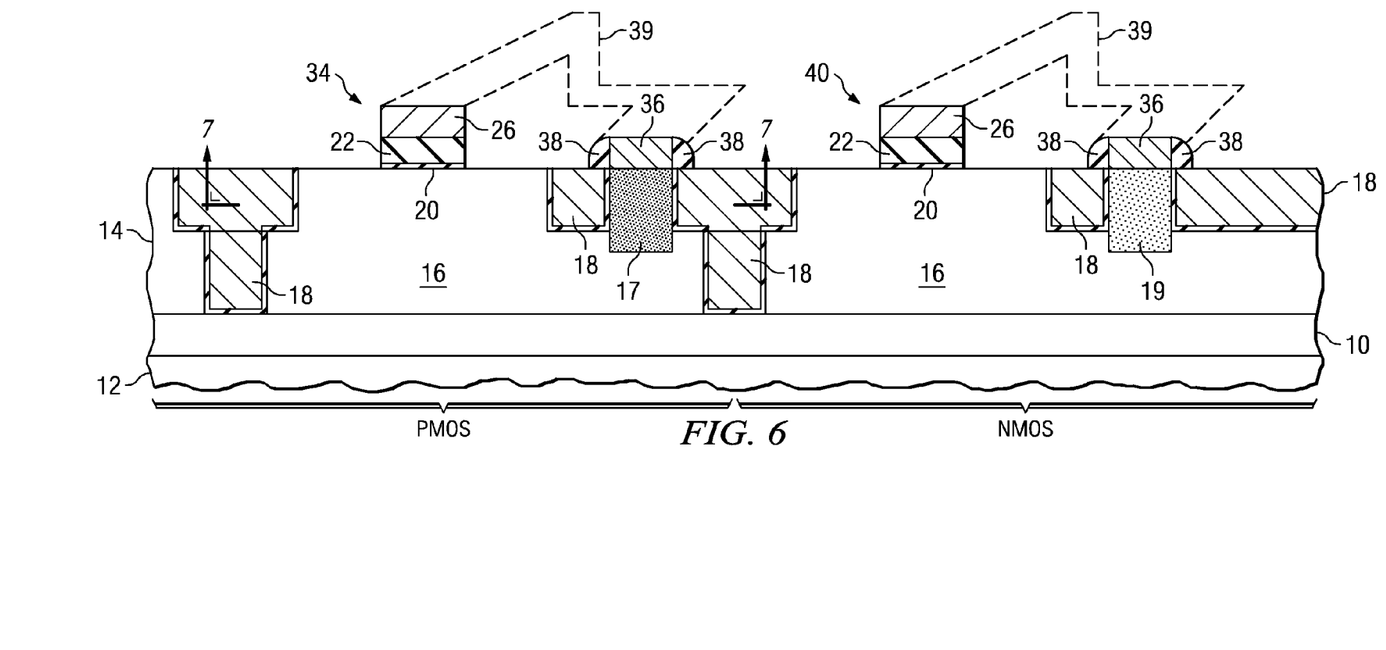
FIG. 6 shows in a schematic manner the CMOS device region of FIG. 5 after patterning of the polysilicon gate and the silicon-germanium layer.
Figure 7:
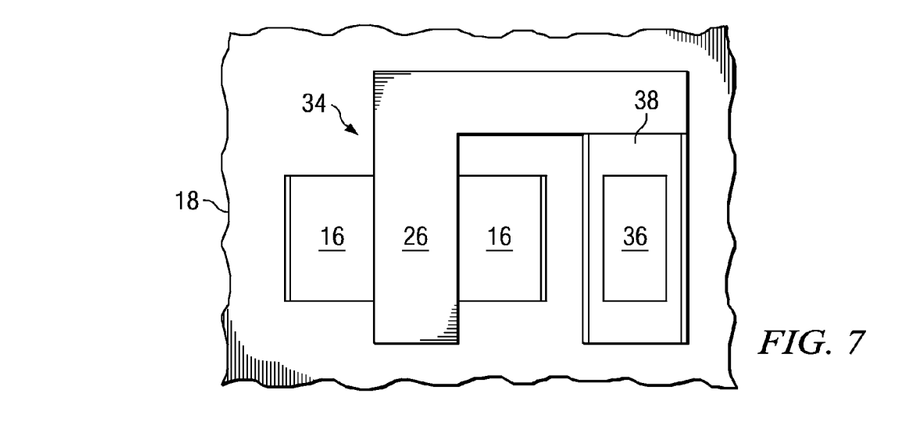
FIG. 7 shows in a schematic manner a part of the integrated circuit of FIG. 6 in a top view.

FIG. 6 of the drawings shows the CMOS device region after patterning of the silicon-germanium layer 26 and the polysilicon gate which consists of the silicon-germanium layer 26 and the polysilicon layer 22. This patterning step is simply referred to as polysilicon patterning. A gate region 34 of the PMOS transistor is formed by the remaining gate oxide of the oxide layer 20 in the PMOS region, the polysilicon layer 22 covering the remaining gate oxide 20 and the polycrystalline silicon-germanium 26 covering the remaining polysilicon layer 22 in the PMOS region. The gate region 34 of the PMOS device is connected with the body contacting structure 36 through the polycrystalline silicon-germanium which has been deposited in the selected region 30 over the electrically inactive regions 18 of the semiconductor layer 14 adjacent the body contacting structure 36. In the following, the polycrystalline silicon-germanium connecting the gate region 34 with the body contacting structure 36 is called connecting structure 38. These facts can be clearly seen in FIG. 7 of the drawings which is a top view of the gate structure 34 with the associated body contacting structure 36 and connecting structure 38. As can be seen, the body contacting structure 36 is surrounded with the connecting structure 38 formed of the polycrystalline silicon-germanium deposited over electrically inactive regions 18. The connecting structure 38 adjoins the gate structure 34 thereby establishing an electrical connection between the gate structure 34 and the body contacting structure 36.

Analogously, a gate region 40 of the NMOS transistor is formed by the remaining gate oxide of the oxide layer 20 in the NMOS region, the polysilicon layer 22 covering the remaining gate oxide 20 and the polycrystalline silicon-germanium 26 covering the remaining polysilicon layer 22. The gate region 40 of the NMOS device is connected with the associated body contacting structure 36 through the polycrystalline silicon-germanium which has been deposited in the selected region 32 over the electrically inactive regions 18 of the semiconductor layer 14 adjacent the body contacting structure 36.

Figure 8:
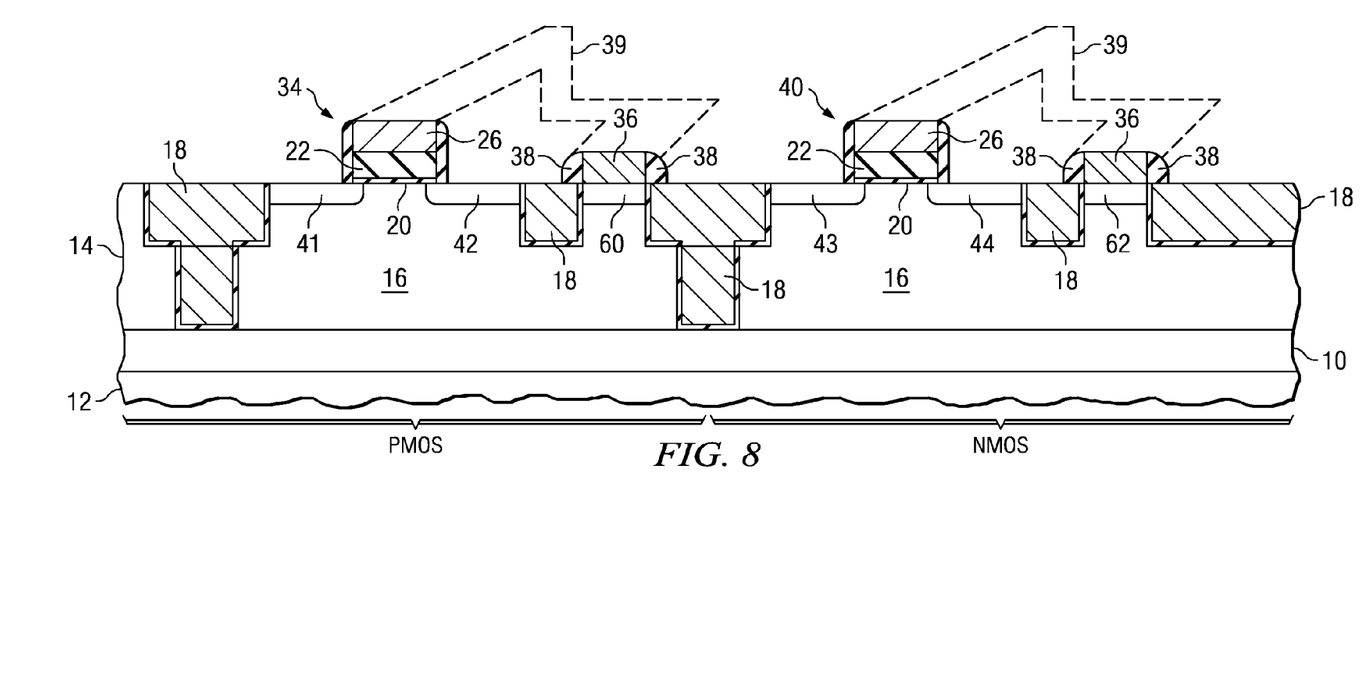
FIG. 8 shows in a schematic manner a CMOS device region in accordance with the first embodiment of the invention after patterning of the polysilicon gate and the silicon-germanium layer and after source/drain formation.

In the present technology the NMOS source and drain regions 43, 44 and the connecting structure 38 are simultaneously implanted with N type dopants together with other specified regions of the circuit (FIG. 8), but the self-protect procedure also applies to other doping schemes. Similarly, the PMOS source and drain regions 41, 42 and the associated connecting structure 38 are simultaneously implanted with P type dopants together with other specified regions of the circuit, but the self-protect procedure also applies to other doping configurations. In the embodiment of FIG. 8, the CMOS device region does not comprise an N sinker and a P sinker as the embodiment shown in FIGS. 1 to 7. In any case, i.e. with or without sinkers being formed in the CMOS device region, the gates 34, 40 are protected prior to polysilicon patterning since the body contacting structures 36 connect the gates 34, 40 with the electrically active regions 16 of the CMOS device and a protective diode is also formed in the electrically active regions 16 during processing and thermal cycles before polysilicon patterning.

FIG. 8 shows the CMOS device region after polysilicon patterning and after source/drain implant with PN junctions 60, 62 that are formed after source/drain implant and annealing.

In an alternative modification of the method of the present invention the patterned base region 24 shown in FIG. 2 of the drawings is the base region of the PNP transistor instead of that of the NPN transistor, so that defining and etching of the selected regions 30, 32 of the CMOS device is made in the same process step as defining and etching of the base region of the PNP transistor.

In the integrated circuit according to the present invention each gate region 34, 40 of the CMOS device is associated with a respective body contacting structure 36. The charge carriers which accumulate in the gate regions 34, 40 can be dissipated via the body contacting structures 36 into the semiconductor layer 14. Providing the body contacting structures 36 and connecting structures 38 does not require additional process steps since the body contacting structures 36 and connecting structures 38 of the selected regions 30, 32 are defined and created in the same process steps in which the base region 24 of the NPN transistor is defined and created. Since each gate region 34, 40 is connected with the body contacting structure already prior to gate patterning, gate self-protection is provided also during patterning of the gate.

Figure 9:
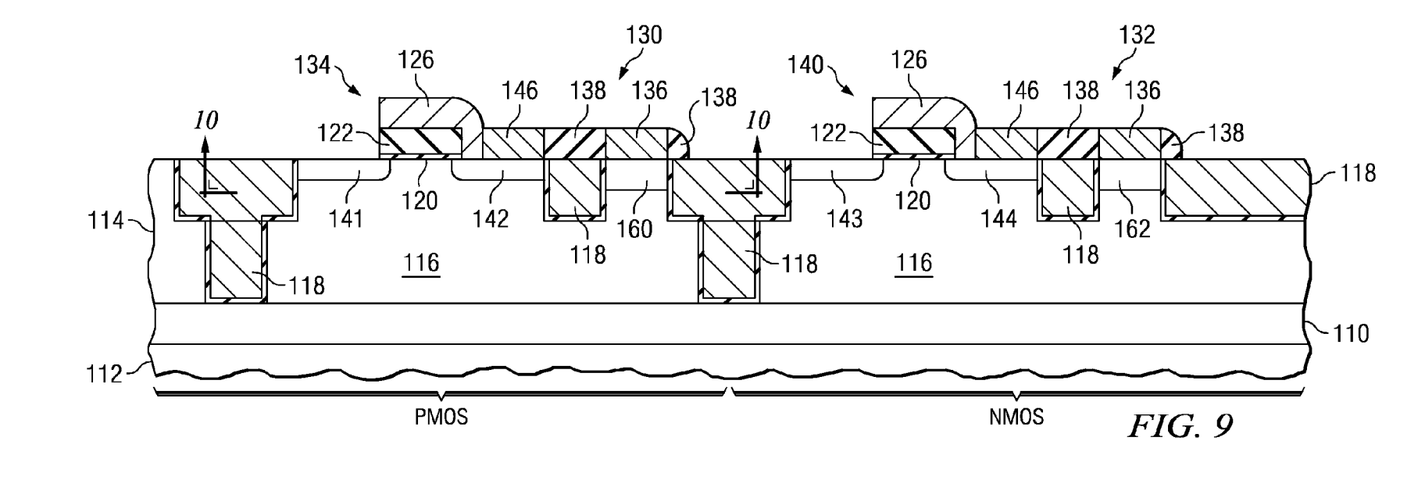
FIG. 9 shows in a schematic manner a second embodiment of the integrated circuit according to the present invention with a local interconnect between the gate region and the drain region of the MOS transistor and with gate self-protection.
Figure 10:
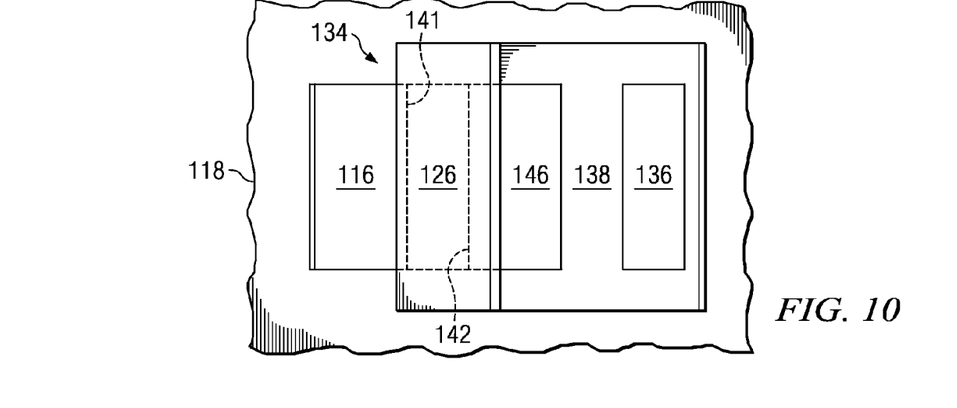
FIG. 10 shows in a schematic manner a part of the integrated circuit of FIG. 9 in a top view.
Figure 11:
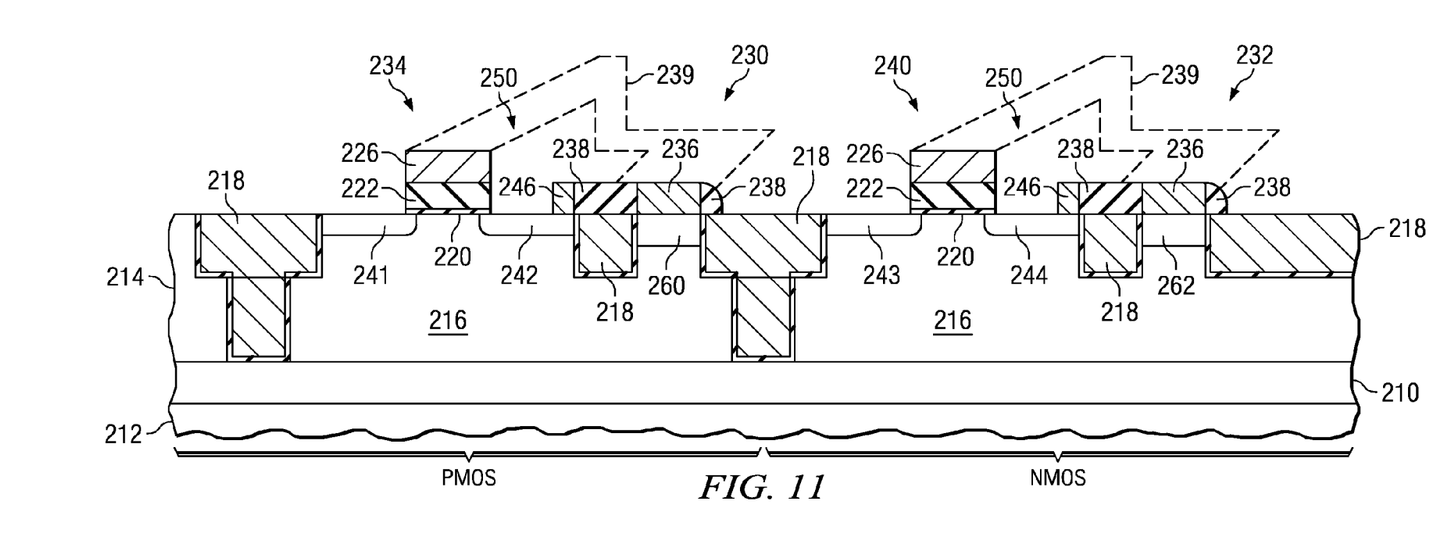
FIG. 11 shows in a schematic manner a third embodiment of the integrated circuit according to the present invention with a local interconnect between the gate region and the drain region of the MOS transistor and with gate self-protection.

According to another aspect of the present invention local interconnects between the gate region and the drain region of a MOS device can be created without the need for contact and metal wiring. The CMOS device region of a preferred integrated circuit with local interconnects between the gate and drain regions is schematically illustrated in FIGS. 9, 10 and 11 of the drawings. For forming the local interconnects the selected regions of the NMOS and PMOS transistors are defined so as to comprise the drain region of the respective transistor. Thus, when depositing the silicon-germanium layer after removing of the gate conductor layer and the dielectric layer in the selected regions the silicon-germanium also grows over the drain regions of the MOS devices thereby establishing a connection to the drain region.

FIG. 9 shows a first embodiment of an integrated circuit with a local interconnect between the gate region 134 and drain region 142 of the PMOS transistor and a local interconnect between the gate region 140 and drain region 144 of the NMOS transistor. The integrated circuit is shown after polysilicon patterning. According to this embodiment the single-crystal silicon-germanium layer 146 deposited over the drain regions 142, 144 extends to the gate region 134, 140 of the respective MOS transistor so that a direct connection is established between the drain regions 142, 144 and the gate regions 134, 140, respectively. This is due to the fact that during patterning of the MOS gates only one edge of the gate is patterned, namely only the one on the side of the gate which is opposite to the drain region 142, 144, respectively. The single-crystal silicon-germanium deposited over the drain regions 142, 144 form second body contacting structures 146. In addition to the drain regions 142, 144 the selected regions 130, 132 also comprise electrically active regions 116 and electrically inactive regions 118 separating junctions, e.g. drains 42, 44 from junctions 60, 62, and electrically active regions 116 of adjacent devices from each other. The silicon-germanium layer deposited over the electrically active regions 116 forms the first body contacting structures 136 which are provided for gate self-protection. Each gate region 134, 140 is connected with the associated first body contacting structure 136 through the polycrystalline silicon-germanium deposited over the electrically inactive regions adjacent the first and second body contacting structures 136, 146. These facts can be clearly seen in FIG. 10 of the drawings which schematically shows the gate region 134 of the PMOS transistor with its associated first body contacting structure 136 and connecting structure 138 and the second body contacting structure 146 above the drain region 142 of the MOS transistor of FIG. 9 in a top view.

FIG. 11 shows a second embodiment of an integrated circuit with a local interconnect between the gate regions 234, 240 and drain regions 242, 244 of the PMOS and NMOS transistors after patterning and removing of the polycrystalline silicon-germanium layer 226 and the polysilicon layer 222. The embodiment shown in this figure differs from the embodiment shown in FIG. 9 in that the deposited single-crystal silicon-germanium in the drain regions 242, 244 of the MOS devices does not extend to the respective gate regions 234, 240, but a gap 250 is formed between them. In this embodiment during patterning of the MOS gates both edges of the gate are patterned simultaneously. In this embodiment the gate regions 234, 240 and drain regions 242, 244 of the MOS transistors are connected through the polycrystalline silicon-germanium layer over the electrically inactive regions 218 which forms the connecting structures 238.

Source/drain implants are done after poly patterning, so that in the embodiment of FIGS. 9 and 10 of the drawings they do not reach the drain regions 142, 144 directly. Instead, the implants go into the silicon-germanium layer 126 above the gate polysilicon 122, the first body contacting structure 136, the connecting structure 138 and the second body contacting structure 146, and then diffuse into regions 142, 160, 144, 162 during the source/drain anneal.

Similarly, in FIG. 11 the source/drain implants go directly into the gaps 250 but indirectly under the second body contacting structures 246 (as well as under the first body contacting structures 236) by diffusion from the second body contacting structures 246 into the region 216 of the semiconductor layer 214. While all junctions are shown for simplicity at the same depth, they can be slightly different in regions where the source/drain is implanted directly into regions 116, 216 than in regions where they diffuse from the base layer 126, 226 into the region 116, 216.

The circuit of the first embodiment shown in FIG. 9 of the drawings is reduced in overall size compared to the circuit of the second embodiment shown in FIG. 11 of the drawings. However, since in the second embodiment both gate edges are patterned at the same time a better control with respect to the gate dimensions is given compared to the first embodiment in which only one edge of the gate is etched.

FIGS. 9 to 11 show integrated circuits in accordance with the present invention in which both gate self-protection and local interconnects between the gate and drain regions are provided. According to the present invention it is also possible to provide local interconnects between the gate and drain regions without providing gate self-protection. In this case the polysilicon layer is only patterned in the base region of the NPN transistor and in the drain regions of the MOS devices, but not in additional electrically active regions 116, 216 of the NMOS and PMOS transistors.

What is claimed is:

1. A method of fabricating an integrated circuit with gate self-protection, said integrated circuit comprising a MOS device and a bipolar device region, said method comprising the steps of depositing a dielectric layer over a semiconductor layer in which electrically active and electrically inactive regions are formed;

depositing a gate conductor layer over said dielectric layer;

defining a base region of said bipolar device region and a selected region of said MOS device, wherein in said selected region of said MOS device said dielectric layer overlies an electrically active region of said semiconductor layer;

removing said gate conductor layer in said base region of said bipolar device region and in said selected region of said MOS device;

removing said dielectric layer in said base region of said bipolar device region and in said selected region of said MOS device;

depositing a base layer on said gate conductor layer and on said semiconductor layer in said selected region of said MOS device and in said base region of said bipolar device region.

2. The method according to claim 1, further comprising the step of patterning said base layer for forming a gate structure of said MOS device and a body contacting structure, said base layer deposited over said electrically active region in said selected region of said MOS device forming said body contacting structure, and said body contacting structure being electrically connected with said gate structure of said MOS device.

3. The method according to claim 1, wherein in said selected region of said MOS device an electrically inactive region adjacent to said electrically active region is located.

4. The method according to claim 3, wherein said gate structure of said MOS device is electrically connected with said body contacting structure through said base layer deposited over said electrically inactive region in said selected region.

5. The method according to any of claims 1, wherein said electrically active region in said selected region comprises the drain region of said MOS device.

6. The method according to claim 5, wherein said body contacting structure contacts the gate structure of said MOS device.

7. The method according to claim 1, wherein said bipolar device region is an NPN transistor region.

8. The method according to claim 1, wherein said bipolar device region is a PNP transistor region.

9. The method according to claim 1, wherein said base layer is a silicon-germanium layer.

10. The method according to claim 1, wherein said dielectric layer is an oxide layer.

11. The method according to claim 1, wherein said gate conductor layer is a polysilicon layer.

* * * * *

UNITED STATES PATENT AND TRADEMARK OFFICE
CERTIFICATE OF CORRECTION

PATENT NO.        : 7,772,057 B2                                         Page 1 of 1
APPLICATION NO.   : 11/470760
DATED             : August 10, 2010
INVENTOR(S)       : El-Kareh et al.

It is certified that error appears in the above-identified patent and that said Letters Patent is hereby corrected as shown below:

On the title page, please insert the following section:
-- Foreign Application Priority Data
2005-09-15   (DE) . . . . . . .   10 2005 044 124.6 --

Signed and Sealed this
Eighteenth Day of January, 2011

David J. Kappos
*Director of the United States Patent and Trademark Office*